(12) United States Patent
Chandra et al.

(10) Patent No.: US 6,620,645 B2
(45) Date of Patent: Sep. 16, 2003

(54) MAKING AND CONNECTING BUS BARS ON SOLAR CELLS

(75) Inventors: Mohan Chandra, Merrimack, NH (US); Yuepeng Wan, Nashua, NH (US); Alleppey V. Hariharan, Nashua, NH (US); Jonathan A. Talbott, Amherst, NH (US)

(73) Assignee: G.T. Equipment Technologies, Inc, Merrimack, NH (US)

( * ) Notice: Subject to any disclaimer, the term of this patent is extended or adjusted under 35 U.S.C. 154(b) by 0 days.

(21) Appl. No.: 09/993,587

(22) Filed: Nov. 16, 2001

(65) Prior Publication Data

US 2002/0056473 A1 May 16, 2002

Related U.S. Application Data

(63) Continuation-in-part of application No. 09/802,072, filed on Mar. 8, 2001.
(60) Provisional application No. 60/249,122, filed on Nov. 16, 2000.

(51) Int. Cl.[7] .......................... H01L 21/00; H01L 21/44; H01L 25/00; B05D 1/08
(52) U.S. Cl. .......................... 438/98; 438/610; 136/244; 427/446
(58) Field of Search .................. 438/98, 610; 136/244; 427/446, 449

(56) References Cited

U.S. PATENT DOCUMENTS

| | | | |
|---|---|---|---|
| 4,003,770 A | | 1/1977 | Janowiecki et al. |
| 4,240,842 A | | 12/1980 | Lindmayer |
| 4,297,391 A | | 10/1981 | Lindmayer |
| 4,320,251 A | | 3/1982 | Narasimhan et al. |
| 4,331,703 A | | 5/1982 | Lindmayer |
| 4,400,577 A | * | 8/1983 | Spear .......................... 136/259 |
| 4,449,286 A | * | 5/1984 | Dahlberg ...................... 29/572 |
| 4,492,812 A | * | 1/1985 | Lindmayer .................. 136/256 |
| 4,511,600 A | * | 4/1985 | Leas ........................... 427/75 |
| 5,131,954 A | * | 7/1992 | Vogeli et al. ............... 136/244 |

FOREIGN PATENT DOCUMENTS

| | | | | |
|---|---|---|---|---|
| JP | 06104466 A | * | 4/1994 | |
| JP | 406104466 A | * | 4/1994 | |

* cited by examiner

*Primary Examiner*—John F. Niebling
*Assistant Examiner*—Viktor Simkovic
(74) *Attorney, Agent, or Firm*—Maine & Asmus

(57) ABSTRACT

A method for fabricating multi-cell solar devices using thermal spray deposition techniques to spray metal powder directly on solar cells and on the backing upon which solar cells are assembled, to form collection grid lines, bus bars, electrodes and interconnections between solar cells.

16 Claims, 1 Drawing Sheet

MAKING AND CONNECTING BUS BARS ON SOLAR CELLS

This application claims priority for all purposes to U.S. application Ser. No. 60/249,122 filed Nov. 16, 2000, and Ser. No. 09/802,072 filed Mar. 8, 2001.

TECHNICAL FIELD OF THE INVENTION

The invention relates to the application of bus bars for interconnecting solar cells, and in particular to thermal spray depositing of bus bars across the grid line surfaces and the back surfaces of solar cells to form interconnections for a sequence of solar cells to make a solar panel.

BACKGROUND OF THE INVENTION

The prior art and practice for making the connection between solar cells is generally by the use of wires or tabs to connect the bus bars of the front side of one cell to the metallized back side of the next cell, although the detailed procedures employed by different manufacturers might vary. A typical tabbing process for connecting solar cells in series is described below.

By using a specially designed tabbing and stringing machine, a metallized solar cell is laid on two parallel copper tabs that are coated with a silver-tin alloy. These two tabs are soldered to the back of the cell through two rows of silver pads that are previously screen-printed on the back surface of the cell. The reason for using silver pads is that the connecting tabs cannot be soldered on an aluminum surface directly, which is the material used for the metallization of the back surface.

Another two metal tabs, each about twice the length of a cell, are then placed on the front surface of the first cell with one end covering each screen-printed bus bar. This end of the tabs is soldered to the printed bus bars. The other end of each of the two metal tabs is then bent over the end edge of the solar cell to the level of the backside surface of the next cell, extending over the intended position for the next cell, and are then cut off at about the full length of the next cell.

The next cell is then laid backside down on the extended tab ends. The steps described in the last two paragraphs are repeated for this and consecutive cells until the desired number of cells are linked to form a string or row of cells in the panel. A solar panel is constructed by linking one or several rows of such cells into an array. Solar panels commonly use arrays ranging, for example, from 1 row of 9 cells to 4 rows of 9 cells. Other sizes are possible.

In the prior art process, the tabbing machine is very complex, combining mechanical parts that move and cut tabs and electrical parts that heat up the cell surface and solder the tabs. Moreover, for the soldering of tabs on the back side, an extra step is required for screen-printing the silver pads. This adds to the cost of machines and working space, as well as to production time and costs, since extra machines for printing and baking are necessary.

Referring now to another area of art, thermal spray is a relatively mature technology for making coating layers. This technology uses hot jet methods (now cold jet methods are also available) to accelerate and melt or soften powder particles that are fed into the jet. The high speed particles or droplets deposit on a surface and form the desired coating. Application of thermal spray technology has been explored in last two decades especially in the area of amorphous silicon solar cell manufacturing; see Janowiecki et al's U.S. Pat. No. 4,003,770, published Jan. 18, 1977.

Plasma spraying for this technology was mainly used for thin film silicon deposition on glass or other substrates. The use of arc plasma spray for deposition of metal contacts on silicon substrates has also been reported: see Lindmayer's U.S. Pat. No. 4,240,842 published Dec. 23, 1980, U.S. Pat. No. 4,297,391 published Oct. 27, 1981, and U.S. Pat. No. 4,331,703 published May 25, 1982; and Narasimhan et al's U.S. Pat. No. 4,320,251 published Mar. 16, 1982.

In summary, there is room for improvement in the setup and production costs and efficiency with which solar panels are constructed from solar cells, such as might be achieved by novel combinations and adaptations of existing and new techniques.

SUMMARY OF THE INVENTION

The basic concept of this invention resides in a new application of well established thermal spray technology, for the fabrication or application of conductive paths and connections directly to a single- or poly-crystalline silicon solar cell and of interconnections between cells.

It is an object of this invention to provide a method for making bus bars on solar cells which link the grid lines or contact fingers on the front surface. It is a further object of this invention to use the same method to extend the deposited bus bar from the top surface of one cell onto a backing or base material for interconnecting a next sequential solar cell, and so on, to form a connected row of cells as for a solar panel.

It is a still further the object of this invention to make the interconnection of cells at much faster and economical manner than is the prior art practice. Another object is to provide a method of interconnection of cells that is of much better electrical and mechanical quality compared to prior art practices, which leads to improved solar/electric conversion efficiencies. It is a yet further the object to enable the interconnection of solar cells by a single apparatus instead of multiple-step, tabbing and stringing equipment as is currently practiced.

Other and numerous objects and advantages will be apparent from the figures, description of preferred embodiments, abstract, and claims that follow.

BRIEF DESCRIPTION OF THE DRAWINGS

The foregoing and additional objects, features and advantages of the present invention will become more apparent to those skilled in the art from consideration of the accompanying detailed description of preferred embodiments thereof, taken in conjunction with the accompanying drawings, in which.

DESCRIPTION OF THE PREFERRED EMBODIMENT

Figure 1:
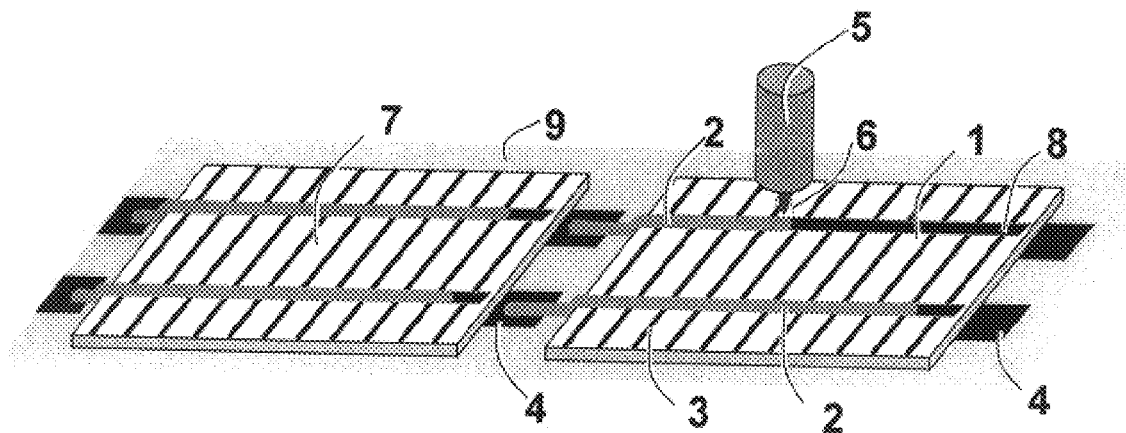
FIG. 1 depicts the making of bus bars on the front surface of a first solar cell, and connecting the bus bars to the backside of the next cell, by using thermal spray deposition technique.
Figure 2:
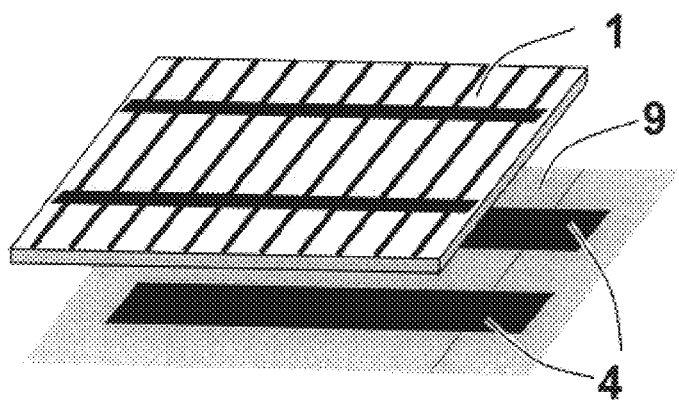
FIG. 2 shows the connection of the bus bars on the base material to the metallized back surface of a solar cell.

The prior art pre-metallized single- or poly-crystalline silicon solar cell that is reference 1 in FIGS. 1 and 2, normally contains contact fingers or collecting grid lines, silver being their major component, on its front surface and a thin metal layer, usually aluminum, on its back surface. Bus bars, usually two in parallel, are laid across the contact fingers as collecting electrodes. The line width of the contact fingers and bus bars are very small so that only a tiny part of the front surface is shadowed by the metal electrodes. Typically the metal in the front covers about 7–8% of the surface area.

In the fabrication of solar devices such as solar panels, the bus bars on the front of one solar cell are electrically bonded to the back of the next solar cell. In this way, a chain of solar cells is interconnected in series to form a solar string of useful voltage level. The assembly of solar cells is generally laminated and encapsulated in glass. There may be a single row or more than one row of cells in a panel.

The invention relates to a method for depositing metal bus bars on solar cells and on the base material or backing sheet upon which they are assembled, and for interconnecting the solar cells, using thermal spray. The invention is not restrictive to the type of pattern or the metal that can be used for making the electrodes and their connection. The thermal spray apparatus might be any kind suitable to this art, such as plasma spray, flame spray or cold spray.

Thermal spray technique has been traditionally a surface engineering method for depositing metal, alloy, ceramic and polymer on a relatively larger surface area. Its application to laying an electrode with fine geometry is emerging with the development of the thermal spray direct write technology. With the same spraying and coating mechanism, the direct write spray system has downscaled nozzle geometry and jet dimensions. Such systems are capable of making a line-patterned deposit with a width as small as 0.1 millimeter. For the bus bars of a typical line width of about 1.0 mm, the thermal spray direct write technique is a preferred embodiment choice for satisfying the objectives of the invention, although other thermal spray methods, such as using of a patterned mask, are within the scope of the invention. The following preferred embodiment description will be based on the thermal spray direct write method.

Referring to the figures, and specifically to FIG. 1, a pre-metallized solar cell 1 is shown in the process of having a bus bar 2 applied by direct write thermal spraying. Specifically, a spray gun 5 emits the spray 6 consisting of the hot jet with the desired metal particles therein, whereby the desired bus bar 2 is applied to the front surface of solar cell 1, by the thermal spraying process. Bus bar 2 is initiated, with a suitable overlap to assure connectivity, on the backside electrode 4 of the previously connected solar cell 7. Backside electrode 4 extends past the leading edge of cell 7 for that purpose. Bus bar 2 ends a little before the leading edge of cell 1, providing a frontside connection across all grid lines 3 of the cell.

Two parallel bus bars 2 are typically laid on the same solar cell. If the solar cell contains two bus bars 8 that were previously screen-printed, as the case illustrated in FIG. 1, the spray deposited bus bars 2 should be configured to deposit over existing bus bars 8 without unnecessary overlap onto the solar collection surface. In this case, the length of deposited bus bar 2 can be limited to overlapping bus bar 8 sufficiently for connectivity, thereby connecting backside electrode 4 to bus bar 8.

Referring to FIG. 2, the backside electrodes 4 are metal bus bars laid down previously on the base material 9 of a panel which is usually made of EVA (Ethylene-vinyl acetate). These backside bus bars 4 can also be fabricated by thermal spray depositing metals on the base plate 9, making the production process yet more efficient. A solar cell 1 is then laid on the electrodes 4 with the back side of cell 1, which is aluminum, and which will be secured with tight contact to electrodes 4 when the package is closed. As is evident in both FIGS. 1 and 2, the electrode is laid down and the cell positioned so as to leave a short length of electrodes 4 exposed. The exposed length of the backside electrodes 4 serves as the connecting pad for applying the frontside electrode of the next cell in the row.

Not shown but readily apparent, there may be a pair of spray guns configured for each row of solar cells, one for each bus bar line. Further, there may be a pair of spray guns for each row of an array, as in a production line setup for a particular size, multi-row panel. However, in a preferred embodiment, a single spray nozzle is manipulated by a control head for dispensing all required electrode bus lines on a given solar panel as it is fabricated.

There are several variations to the above described art. One of them is that the pre-metallized cell does not necessarily need the screen-printed bus bars 8 or even the collecting grid lines 3. As already demonstrated by the prior art, e.g. Narasimhan, spray deposited bus bars can be applied directly on silicon with good ohmic contact. Therefore, it is within the scope of the invention to use thermal spray deposition to apply all bus bars and collecting grid lines and cell to cell connections during fabrication of the solar panel.

The most significant advantage of this new method for interconnecting cells is that it eliminates the complex tabbing and stringing process, where the bonding between the tabs and the cell surface has to be achieved by soldering. Because the sprayed metal particles have high velocity and temperature, the coating made by these particles has strong bonding with the substrate materials.

The thermal spray system is the only apparatus needed for the whole process. Compared to the prior art practice, where tabbing requires an intricate machine for mechanical handling and electrical soldering of tabs, and an extra screen-printing machine and a baking oven for the silver pads, the methodology of the invention can significantly reduce the required investment in processing equipment.

This method for interconnecting of cells, when combined with the invention of plasma deposition of contact fingers disclosed in parent U.S. application Ser. No. 09/802,072, greatly simplifies the process for solar cell interconnection.

Yet another advantage is that there is no restriction to the metal that can be used if it is available in the form of a fine powder suitable for spray techniques. In addition to silver; copper, aluminum, nickel, gold or any of their alloys are good candidates, and other metals may be used. Suitable thermal spray methods include any form of the commercially available spray deposition techniques, such as arc plasma spray, flame spray, HVOF, and laser spray.

A yet further advantage lies in the ability to control line thickness or depth of a conductor path, as well as width, affecting, for example, robustness or current capacity. In addition to primary control of the density, volume and process conditions of the material being sprayed and the speed of the traversing spray jet, the user can apply multiple layers on all or selected regions of the conducting paths on or between solar cells.

The invention as illustrated and claimed below is susceptible of other embodiments and explanations. For example, there is a method for constructing electrically conductive paths on the face of a solar cell, consisting of the steps of using metallic materials in powdered form, using thermal spray techniques, and spraying the materials directly on the face of the solar cell in a predetermined frontside pattern of conductive paths, which can include bus bars and collection grid lines. The frontside pattern can extend off the face of the solar cell and connect to a backside electrode of another solar cell, forming a backside to frontside connection between adjacent solar cells.

The thermal spray technique may be employed using a single spray nozzle having two-axis, X-Y traversing capability so as to be able to spray a pattern extending anywhere over the area of an assembly station for solar devices. Alternatively there may be employed a stationary set of spray nozzles over a moving assembly line, where solar cells are applied sequentially to a backing sheet as the necessary conductive paths and connections are applied.

The metallic materials in powdered form may be or contain silver, or other metals alone or in alloy form suitable for this application.

As another example, there is a method for providing off-cell electrodes for a solar cell device. Providing electrodes off the body of the solar cell makes solder connections available without exposing the cell to the solder process directly. One such method of the invention includes the steps of using metallic materials in powdered form, using thermal spray techniques, spraying the materials directly on the backing sheet of the solar device in a predetermined backside pattern of conductive paths, and placing a solar cell on the backing sheet such that the metal back of the solar cell makes electrical contact with the conductive paths, but having a portion of the backside pattern conductive paths remaining extended and exposed beyond the leading edge of the solar cell so as to be available as a first off-cell electrode. Then, spraying the materials directly on the face of the solar cell in a predetermined frontside pattern of conductive paths, where the frontside pattern is overlapping off the trailing edge of the solar cell onto the backing sheet so as to be available as the second off-cell electrode.

Of course, the frontside pattern of one cell may be overlapping the backside pattern of an adjacent solar cell so as to form a connection between cells.

As yet another example, there is a method for constructing a serially connected multi-cell solar device consisting of the steps of using metallic materials in powdered form, using thermal spray techniques, spraying the materials directly on the backing sheet of the solar device in a predetermined backside pattern of conductive paths, and placing a first solar cell on the backing sheet such that the metal back of the first solar cell contacts the backside pattern conductive paths and a portion of the backside conductive paths remain extending beyond the leading edge of the first solar cell for use as a connecting electrode. Then spraying the materials directly on the face of the first solar cell in a predetermined frontside pattern of conductive paths, where the frontside pattern overlaps off the trailing edge of the cell onto the backing sheet so as to be available as a first of two device electrodes.

Then repeating the above steps using a next solar cell in each iteration of steps until the desired number of cells have been used, where the frontside pattern conductively laps over the trailing edge of each new solar cell onto the connecting electrode of the previous solar cell to form a connection. The last connecting electrode extending from the last placed cell becomes the second of the two device electrodes, serially connecting the row of cells from one end to the other.

As still yet another example, there is a method for constructing a multi-row device, by combining two or more of the serially connected multi-cell solar devices just described. The two or more rows may be connected in parallel or in series, according to the particulars of the design.

We claim:

1. A method for constructing electrically conductive paths on the face of a crystalline solar cell, comprising the steps of:
    using metallic materials in powdered form,
    using thermal spray techniques, and
    spraying said materials directly on the face of said crystalline solar cell in a predetermined frontside pattern of said conductive paths
        said frontside pattern extending off the face of said crystalline solar cells and connecting to a backside electrode of another solar cell.

2. A method for constructing electrically conductive paths according to claim 1, said using thermal spray techniques comprising using a single spray nozzle having two axis traversing capability over the area of an assembly station.

3. A method for constructing electrically conductive paths according to claim 1, said metallic materials in powered form comprising silver.

4. A method for providing off-cell electrodes for a crystalline solar cell device comprising the steps of:
    using metallic materials in powdered form,
    using thermal spray techniques,
    spraying the materials directly on the backing sheet of the solar device in a predetermined backside pattern of conductive paths,
    placing a crystalline solar cell on the backing sheet such that the metal back of the crystalline solar cell makes electrical contact with the conductive paths and a portion of the backside pattern conductive paths remain extending beyond the leading edge of the crystalline solar cell so as to be available as a first said off-cell electrode,
    spraying the materials directly on the face of the crystalline solar cell in a predetermined frontside pattern of conductive paths, said frontside pattern overlapping off the trailing edge of the crystalline solar cell onto the backing sheet so as to be available as a second said off-cell electrode.

5. A method for providing off-cell electrodes according to claim 4, said frontside pattern including bus bars.

6. A method for providing off-cell electrodes according to claim 4, said frontside pattern including collection grid lines.

7. A method for providing off-cell electrodes according to claim 4, said frontside pattern of said crystalline solar cell overlapping the backside pattern of an adjacent said solar cell.

8. A method for providing off-cell electrodes according to claim 4, said using thermal spray techniques comprising using a single spray nozzle having two axis traversing capability over the area of an assembly station.

9. A method for providing off-cell electrodes according to claim 4, said using thermal spray techniques comprising using stationary spray nozzles over a moving assembly line.

10. A method for providing off-cell electrodes according to claim 4, said metallic materials in powered form comprising silver.

11. A method for constructing a serially connected multi-cell solar device comprising the steps of:
    using metallic materials in powdered form,
    using thermal spray techniques,
    spraying the materials directly on the backing sheet of the solar device in a predetermined backside pattern of conductive paths,
    placing a first crystalline solar cell on the backing sheet such that the metal back of the first crystalline solar cell contacts the backside pattern conductive paths and a portion of the backside conductive paths remain extending beyond the leading edge of the first crystalline solar cell for use as a connecting electrode, spraying the materials directly on the face of said first crystalline solar cell in a predetermined pattern of conductive paths, said frontside pattern overlapping off the trailing edge of said first crystalline solar cell onto the backing sheet so as to be available as a first of two device electrodes, repeating the above steps using additional crystalline solar cells until the desired number of cells have been used, said frontside pattern extending off the trailing edge of each additional said crystalline solar cell onto the connecting electrode of the previous solar cell, the last said connecting electrode being the second of said two device electrodes.

12. A method for constructing a serially connected multi-cell solar device according to claim 11, said frontside pattern including bus bars.

13. A method for constructing a serially connected multi-cell solar device according to claim 11, said frontside pattern including collection grid lines.

14. A method for constructing a serially connected multi-cell solar device according to claim 11, said using thermal spray techniques comprising using a single spray nozzle having two axis traversing capability over the area of an assembly station.

15. A method for constructing a serially connected multi-cell solar device according to claim 11, said using thermal spray techniques comprising using stationary spray nozzles over a moving assembly line.

16. A method for constructing a serially connected multi-cell solar device according to claim 11, further comprising the step of combining said multi-cell device with other said multi-cell devices into a multi-row solar device.

* * * * *